United States Patent
Ji

(10) Patent No.: US 9,313,885 B2
(45) Date of Patent: Apr. 12, 2016

(54) FLEXIBLE FLAT CABLE FOR LOW VOLTAGE DIFFERENTIAL SIGNALING

(71) Applicant: Misook Ji, Seoul (KR)

(72) Inventor: Misook Ji, Seoul (KR)

(*) Notice: Subject to any disclaimer, the term of this patent is extended or adjusted under 35 U.S.C. 154(b) by 42 days.

(21) Appl. No.: 14/053,880

(22) Filed: Oct. 15, 2013

(65) Prior Publication Data

US 2015/0014018 A1    Jan. 15, 2015

(30) Foreign Application Priority Data

Jul. 15, 2013 (KR) .......................... 10-2013-0083146

(51) Int. Cl.
*H01B 7/08* (2006.01)
*H05K 1/02* (2006.01)

(52) U.S. Cl.
CPC ...................................... *H05K 1/028* (2013.01)

(58) Field of Classification Search
CPC .......................................................... H01B 7/08
USPC .......................................... 174/117 F, 117 FF
See application file for complete search history.

(56) References Cited

U.S. PATENT DOCUMENTS

| | | | | |
|---|---|---|---|---|
| 4,155,613 A | * | 5/1979 | Brandeau | 439/90 |
| 6,631,559 B2 | * | 10/2003 | Ueno | 29/861 |
| 6,954,983 B2 | * | 10/2005 | Froschl et al. | 29/825 |
| 8,138,421 B2 | * | 3/2012 | Takamatsu et al. | 174/117 F |
| 2006/0180338 A1 | * | 8/2006 | Tai | 174/117 FF |
| 2011/0232938 A1 | * | 9/2011 | Kodama et al. | 174/117 F |
| 2012/0230000 A1 | * | 9/2012 | Ishino et al. | 361/803 |
| 2013/0037303 A1 | * | 2/2013 | Wang | 174/117 FF |

* cited by examiner

*Primary Examiner* — Chau N Nguyen
(74) *Attorney, Agent, or Firm* — Birch, Stewart, Kolasch & Birch, LLP

(57) ABSTRACT

Disclosed is a flexible flat cable including an incision section including a cutting line, a connection section including a conductive line exposure end portion, and a transition section to connect the incision section with the connection section. Plural conductive lines are arranged with a pitch interval of 0.5 mm to form one conductive line group, and plural conductive line groups are arranged with an interval of 1.0 mm, such that the cutting line is in a space having the interval of 1.0 mm between the conductive groups. The conductive lines are collected at an end portion side of the incision section in the transition section, and the connection section includes a linear section which the conductive lines extending from an end portion of the transition section extend while being spaced apart from each other with a pitch of 0.5 mm and a conductive line exposure part exposed to an outside.

12 Claims, 6 Drawing Sheets

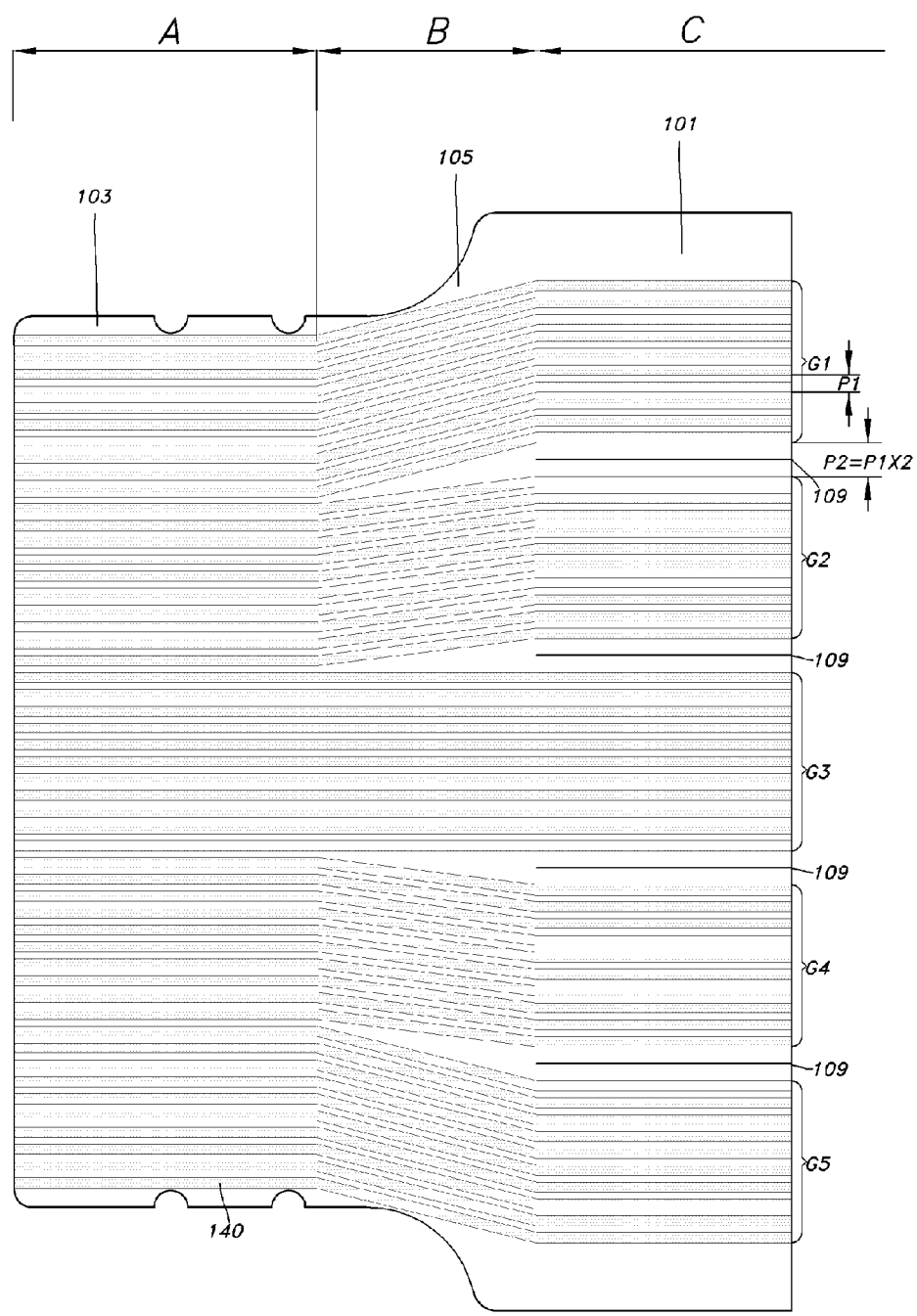

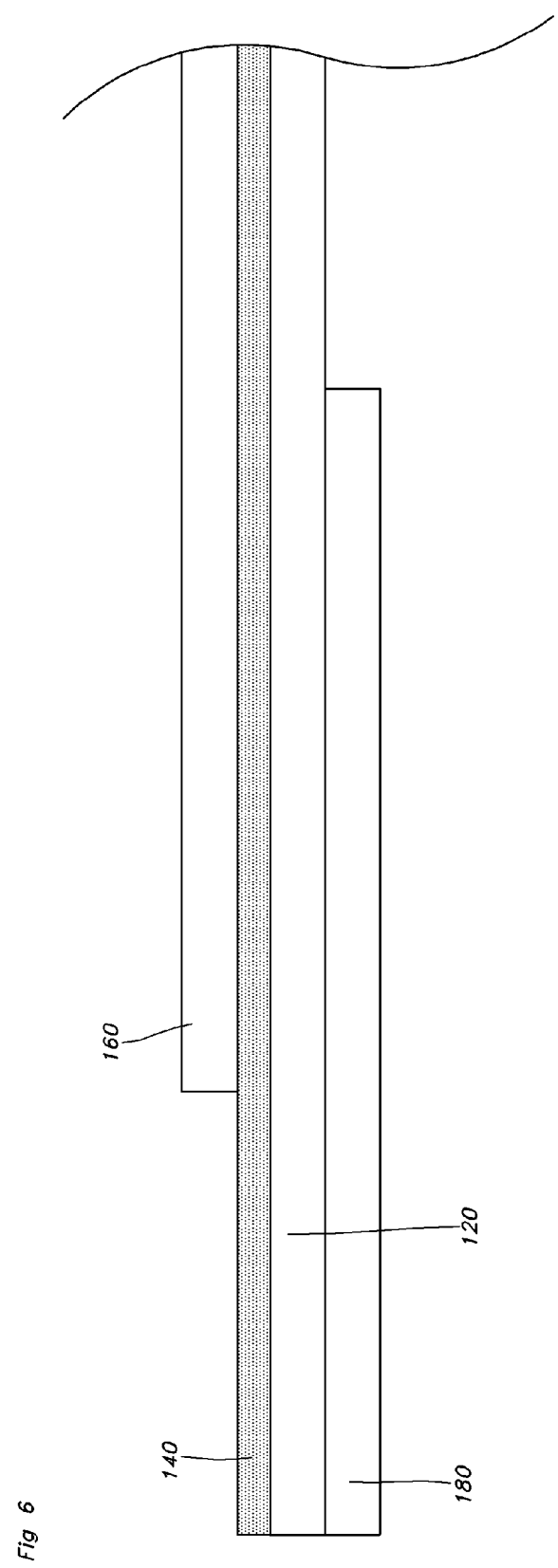

FLEXIBLE FLAT CABLE FOR LOW VOLTAGE DIFFERENTIAL SIGNALING

BACKGROUND OF THE INVENTION

1. Field of the invention

The present invention relates to a flexible flat cable for low voltage differential signaling. In more particular, the present invention relates to a flexible flat cable in which an incision section including an incision part is integrally formed with a connection section including a conductive line exposure part, the connection section includes a transition section, in which conductive lines are collected at an end portion side of the incision section, a linear section in which the conductive lines linearly extend from an end portion of the transition section, and a conductive line exposure part in which the conductive lines are exposed to an outside in the linear section, so that the linear section of the connection section is inserted into a connector to electrically make contact with the connector.

2. Description of the Related Art

A flat cable equipped with a binder is disclosed in Korean Utility Model Application No. 20-2010-2116 (filed on Mar. 2, 2010).

The flat cable equipped with the binder includes a plurality of core wires parallel to each other while being spaced apart from each other with a predetermined distance, an insulator to cover the conductive core wires and having a plurality of incision parts in a longitudinal direction of the conductive core lines, and a binding case to surround an outer portion of the insulator corresponding to the position of the incision parts to confine and organize the conductive core wires.

U.S. Unexamined Patent Publication No. US2013/0037303 (filed on Feb. 14, 2013) discloses "flexible flat cable." The flexible flat cable includes a plurality of conductors provided in parallel to each other and an insulating layer to cover the conductors. The flexible flat cable has cutting lines so that the conductors covered with the insulating layer are divided into several strips and the strips are laminated, thereby reducing the width of the cable.

In order to electrically connect the flexible flat cable with the connector, the end portion of the flexible flat cable is inserted into a connector. Accordingly, in order to easily insert the flexible flat cable into the connector, the end portion of the flat cable is connected with a thin printed circuit board.

The printed circuit board is connected with a core wire of the flexible flat cable at the end portion of the flexible flat cable through a soldering scheme. In the soldering process, connection fail may occur. Further, in the flat cable having the pitch interval of 0.5 mm, the interval between conductors is significantly narrowed, so that the cutting line may not be formed. Accordingly, the flat cable may not be divided into several strips so that the flat cable may not make a lamination structure.

SUMMARY

An object of the present invention is to provide a flexible flat cable in which an incision section including an incision part is integrally formed with a connection section including a conductive line exposure part, the connection section includes a transition section, in which conductive lines are collected at an end portion side of the incision section, a linear section in which the conductive lines linearly extend from an end portion of the transition section, and a conductive line exposure part in which the conductive lines are exposed to an outside in the linear section, so that the connection section is inserted into a connector to perform a connection function.

Another object of the present invention relates to a flexible flat cable in which a plurality of covered conductors are divided into several strips and the strips are laminated in a flat cable having a pitch interval of 0.5 mm so that the width of the flat cable can be reduced.

In order to accomplish the above objects of the present invention, according to one aspect, there is provided a flexible flat cable divided into an incision section including an incision part and a connection section including a conductive line exposure end portion. In the incision section, a plurality of conductive lines constitute one conductive line group, a plurality of conductive line groups are divided by the incision part, and the connection section includes a transition section, in which the conductive lines are collected at the end portion side of the incision section, a linear section in which the conductive lines linearly extend at the end portion of the transition section, and a conductive line exposing end portion in which the conductive lines are exposed to the outside in the linear section, so that the connection section is inserted into a connector to electrically make contact with the connector. Accordingly, the connection section serves as the connector.

According to another aspect, there is provided a flexible flat cable divided into an incision section including a cutting line, a connection section including a conductive line exposing end portion, and a transition section to connect the incision section to the connection line. In the incision section, a plurality of conductive lines are spaced from each other with a pitch interval of 0.5 mm to form one conductive line group, a plurality of conductive line groups are collected while being spaced from each other with a pitch interval of 1.0 mm, and the cutting line is formed in the space having the interval of 1.0 mm between the conductive groups. The conductive lines are collected at the end portion side of the incision section in the transition section, and the connection section includes a linear section, in which the conductive lines extending from the end portion of the transition section linearly extend with the pitch of 0.5 mm, and a conductive line exposing part in which the conductive lines are exposed to the outside.

In the above structure, reinforcement plates are attached to lower portions of the transition section and the connection section. In addition, the incision section may be divided into a plurality of strips by the cutting line.

The conductive line is provided between an upper insulating film and a lower insulating film.

In the incision section, the conductive lines constitute one conductive line group, a plurality of conductive groups are divided with an interval for the cutting line, and the interval has the width of 1.0 mm. The incision section may be bound by a binding unit in the state that the conductive line groups divided by the cutting line can be folded together. Accordingly, the incision section can be freely bent up, down, left or right. The conductive lines are arranged with the interval of 0.5 mm in the linear section of the connection section and the conductive line exposing end portion.

BRIEF DESCRIPTION OF THE DRAWINGS

FIG. 5 is a partial enlarged view of FIG. 4.

FIG. 6 is a sectional view showing a portion of the flexible flat cable according to the present invention.

DETAILED DESCRIPTION OF THE EMBODIMENTS

Hereinafter, an example embodiment of the present invention will be described in detail with reference to accompanying drawings.

Figure 1:
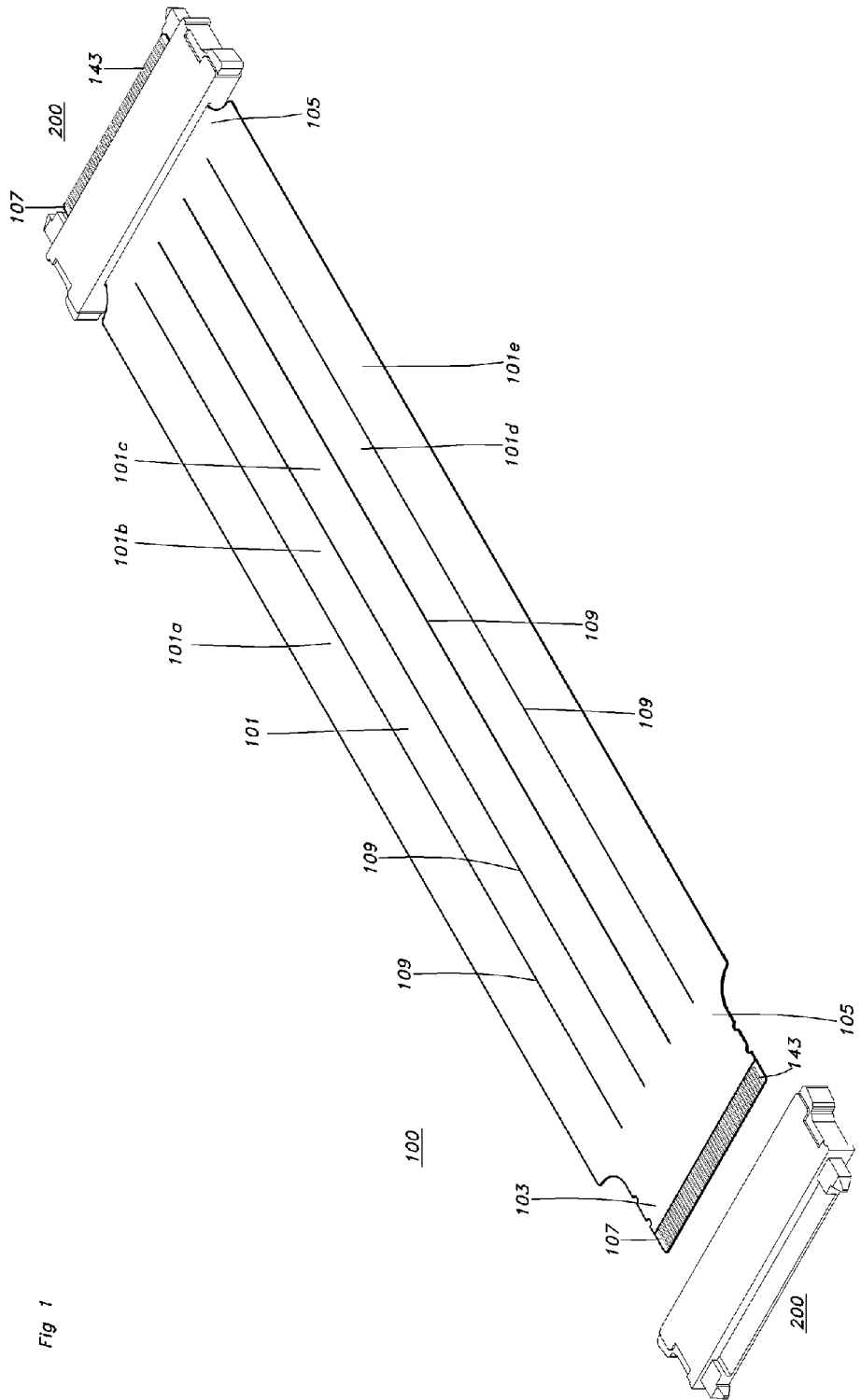
FIG. 1 is a perspective view showing a flexible flat cable according to the present invention.

Referring to FIG. 1, a flexible flat cable according to the present invention includes an incision section 101 having cutting lines 109 extending in a longitudinal direction, a connection section 103 including a conductive line exposing end portion, and a transition section 105 to connect the incision section 101 to the connection. In the incision section 101, a plurality of conductive lines are spaced from each other with a pitch interval of 0.5 mm to form one conductive line group, and a plurality of conductive line groups are collected while being spaced from each other with a pitch interval of 1.0 mm. Each cutting line 109 is formed between a cutting line group and a cutting line group in the incision section 101. The cutting line 109 divides the cutting line groups into strips. In the transition section 105, all conductive lines extending from the incision section 101 are collected so that the conductive lines are spaced apart from each other at a predetermined interval. In the connection section 103, all conductive lines extending from the transition section 105 are provided in the form of a linear line while being spaced apart from with the pitch interval of 0.5 mm, and the end portions of the extended conductive lines are exposed to the outside. For the convenience of explanation, a portion of the conductive lines extending in the form of a linear line while being spaced apart from each other at the pitch of 0.5 mm in the connection section is referred to as a linear section, and the exposed portion of the conductive lines is defined as a conductive line exposure part 107. The linear line section of the connection line is inserted into a connector 200, so that each conductive line exposed through the conductive line exposure part 107 is electrically connected to each of connection terminals of a connector.

Figure 2:
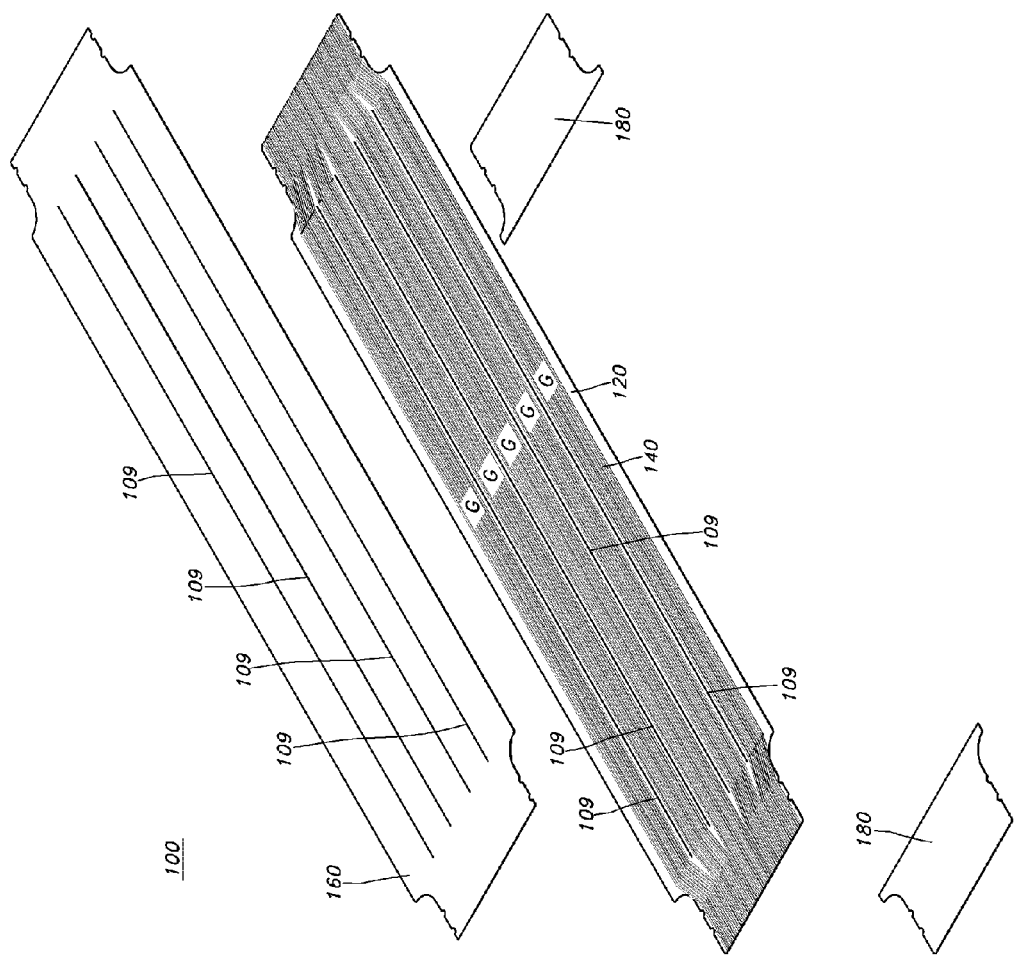
FIG. 2 is an exploded perspective view showing the flexible flat cable according to the present invention.

Referring to FIG. 2, conductive lines 140 of the flexible flat cable are interposed between a lower insulating film 120 and an upper insulating film 160. Both end portions of the upper and lower insulating films 160 and 120 have widths narrower than widths of central portions thereof so that the both end portions serve as connector insertion parts in the final product. In the final product, both end portions of the upper insulating film 160 are shorter than those of the lower insulating film 120 such that conductive lines are exposed to be an electrical connection terminal 143 in the final film. An end portion of the conductive line 140 between the upper insulating film 160 and the lower insulating film 120 is exposed to the outside through both end portions of the upper insulating film 160 shorter than the lower insulating film 120 so that the end portion of the conductive line 140 serves as the electrical connector 143. A reinforcement plate 180 is attached to a lower portion of both end portions of the lower insulating film 120 serving as a connector insertion part. The reinforcement plate 180 reinforces both end portions in the final product, so that the both end portions of the lower insulating film 120 can serve as the connector insertion part without the use of the PCB substrate.

Figure 3:
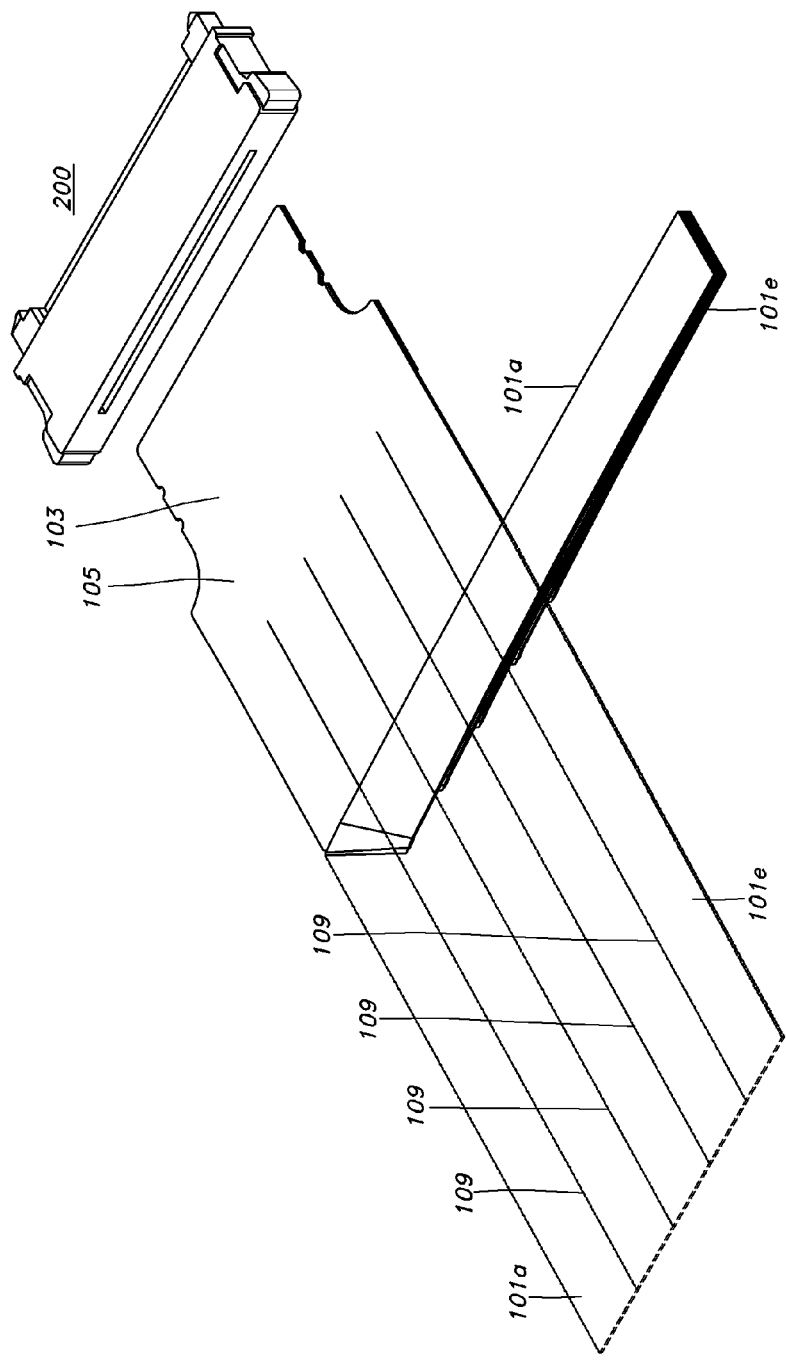
FIG. 3 is a partial perspective view showing the state of the flexible flat cable incised in an incision section and having the structure in which the incision section are laminated according to the present invention.

FIG. 3 shows the incision section 101 in which conductive line groups are divided into strips by the cutting line 109 between the conductive line groups and the conductive line groups are laminated.

Figure 4:
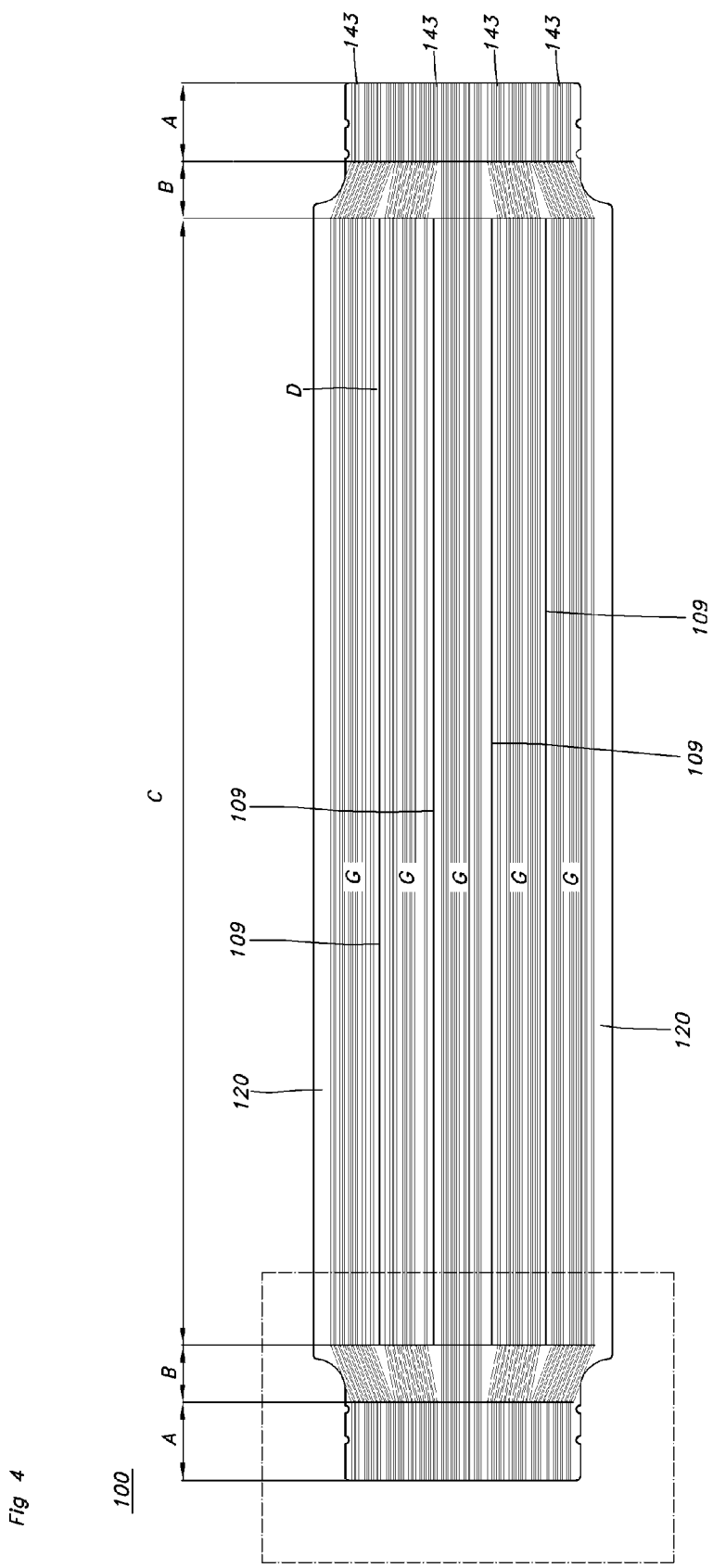
FIG. 4 is a plan view showing the arrangement of conductive lines in the flexible flat cable according to the present invention.

Hereinafter, the arrangement of conductive lines inserted between the upper and lower insulating films 160 and 120 will be described. As shown in FIGS. 4 and 5, a flexible flat cable 100 according to the present invention is divided into an incision section 101 (see reference sign C), in which the cutting line 109 is formed in a longitudinal direction, the connection section 103 (see reference sign A) including the conductive line exposing end portion, and the transition section 105 (see reference sign B) to connect the incision section 101 with the connection section 103. In the incision section 101, the conductive lines are spaced apart from each other with a pitch interval of 0.5 mm to form one conductive line group, and the conductive line groups are collected while being spaced apart from each other with a pitch interval of 1.0 mm. Each cutting line 109 is formed between a cutting line group and a cutting line group in the incision section 101. The cutting line 109 divides the cutting line groups into strips. In the transition section 105 (see reference sign B), all conductive lines extending from the incision section 101 are collected so that the conductive lines are spaced apart from each other at a predetermined interval. In the connection section 103 (see reference sign A), all conductive lines extending from the transition section 105 are provided in the form of a linear line while being spaced apart from with the pitch interval of 0.5 mm, and the end portions of the extended conductive lines are exposed to the outside.

In the incision section 101 (see reference sign C), a plurality of conductive lines 140 are collected while being spaced apart from each other at a pitch P1 of 0.5 mm to form one conductive line group, and the conductive line groups, in which the conductive lines 140 are assembled, are assembled while being spaced apart from each other at an interval of 1.0 mm (P2=2×P1). In the incision section 101 (see reference sign C), the cutting line 109 is formed between the conductive line group and another conductive line group. The cutting lines divide the conductive line groups G1, G2, G3, G4, and G5 into strips. The conductive lines are arranged with the pitch interval P1 of 0.5 mm within one conductive line group, and the interval between the conductive line group and another conductive line group is the width P2 of 1.0 mm.

Referring to FIG. 6, conductive lines 140 of the flexible flat cable according to the present invention are interposed between the lower insulating film 120 and the upper insulating film 160. The end portion of the conductive line 140 is exposed to the outside in the conductive line exposing end portion (see C3) of the connection section C, and the reinforcement plate 180 is attached to the lower insulating film 120 in the connection section C. Reinforcement plates 180 are attached to the lower portion of the both end portions of the lower insulating film 120 serving as the connection part into which the connector is inserted. The reinforcement plates 180 reinforce both end portions of the final product, so that the reinforcement plates 180 serve as the connector insertion part without the use of the PCB substrate.

Therefore, it will be understood to those skilled in the art that various modifications, additions and substitutions are possible, without departing from the scope and spirit of the invention as disclosed in the accompanying claims.

What is claimed is:

1. A flexible flat cable comprising:
an incision section comprising a cutting line;
a connection section comprising a conductive line exposure end portion; and a transition section to connect the incision section with the connection section, wherein reinforcement plates are attached to lower portions of the transition section and the connection section, wherein a plurality of conductive lines are arranged with a pitch interval of 0.5 mm in the incision section to form one conductive line group, and a plurality of conductive line groups are arranged with an interval of 1.0 mm, such that the cutting line is formed within the interval of 1.0 mm between the conductive line groups, wherein the conductive lines in the transition section are collected at an end portion of the incision section, wherein the connection section comprises a linear section where the conductive lines extending from an end portion of the transition section extend while being spaced apart from each other with a pitch of 0.5 mm and said conductive line exposure end portion where the conductive lines are exposed to an outside, and wherein the interval between two adjacent conductive line groups in the incision section decreases in the transition section proceeding in a direction from the incision section to the connection section such that the interval between the two adjacent conductive line groups in the incision section is greater than an interval between the two adjacent conductive line groups in the connection section.

2. The flexible flat cable of claim 1, wherein the incision section is divided into a plurality of strips by the cutting line.

3. The flexible flat cable of claim 1, wherein the plurality of conductive lines are provided between an upper insulating film and a lower insulating film.

4. The flexible flat cable of claim 1, wherein a pitch interval of two immediately adjacent conductive lines of the two adjacent conductive line groups is 0.5 mm in the connection section.

5. The flexible flat cable of claim 1, wherein a pitch interval of two immediately adjacent conductive lines of the two adjacent conductive line groups is greater than 0.5 mm in the incision section.

6. The flexible flat cable of claim 1, wherein a pitch interval of two immediately adjacent conductive lines of the two adjacent conductive line groups is 0.5 mm in the connection section, and the pitch interval of the two immediately adjacent conductive lines of the two adjacent conductive line groups is greater than 0.5 mm in the incision section.

7. The flexible flat cable of claim 1, wherein a pitch interval of all of the conductive lines in the connection section is 0.5 mm.

8. The flexible flat cable of claim 1, wherein a distance between outermost conductive lines at the incision section is greater that a distance between the outermost conductive lines at the connection section.

9. The flexible flat cable of claim 1, wherein a width of the flexible flat cable in the incision section is greater than a width of the flexible flat cable in the connection section.

10. The flexible flat cable of claim 9, wherein a distance between outermost conductive lines at the incision section is greater that a distance between the outermost conductive lines at the connection section.

11. The flexible flat cable of claim 10, wherein a pitch interval of two immediately adjacent conductive lines of the two adjacent conductive line groups is 0.5 mm in the connection section, and the pitch interval of the two immediately adjacent conductive lines of the two adjacent conductive line groups is greater than 0.5 mm in the incision section.

12. The flexible flat cable of claim 11, wherein a pitch interval of all of the conductive lines in the connection section is 0.5 mm.

* * * * *